(12) United States Patent
Arakida et al.

(10) Patent No.: US 6,647,043 B2
(45) Date of Patent: Nov. 11, 2003

(54) SEMICONDUCTOR LASER DEVICE CAPABLE OF PREVENTING DEGRADATION OF CHARACTERISTICS

(75) Inventors: Takahiro Arakida, Tokyo (JP); Hitoshi Hotta, Tokyo (JP)

(73) Assignee: NEC Corporation, Tokyo (JP)

( * ) Notice: Subject to any disclaimer, the term of this patent is extended or adjusted under 35 U.S.C. 154(b) by 64 days.

(21) Appl. No.: 09/860,714

(22) Filed: May 18, 2001

(65) Prior Publication Data

US 2001/0043634 A1 Nov. 22, 2001

(30) Foreign Application Priority Data

May 19, 2000 (JP) ........................................ 2000-147385

(51) Int. Cl.[7] ................................................ H01S 5/00
(52) U.S. Cl. ........................................ 372/46; 372/45
(58) Field of Search ...................... 372/46, 45

(56) References Cited

U.S. PATENT DOCUMENTS

| 4,881,235 A | * | 11/1989 | Chinone et al. | 372/45 |
| 5,822,348 A | * | 10/1998 | Fujii | 372/45 |
| 6,414,977 B1 | * | 7/2002 | Miyashita et al. | 372/46 |

FOREIGN PATENT DOCUMENTS

| JP | 2502835 | * | 3/1996 | H01S/3/18 |

* cited by examiner

*Primary Examiner*—Quyen Leung
(74) *Attorney, Agent, or Firm*—Scully, Scott, Murphy & Presser

(57) ABSTRACT

A semiconductor laser device includes an inner lower clad layer formed on a semiconductor layer, an active layer formed on the inner lower clad layer, an inner upper clad layer formed the active layer, a blocking layer formed on the inner upper clad layer to block current, wherein the blocking layer having a concave portion, and an outer upper clad layer formed to cover the blocking layer. Carriers are injected to the active layer through the outer upper clad layer and the concave portion of the blocking layer.

7 Claims, 7 Drawing Sheets

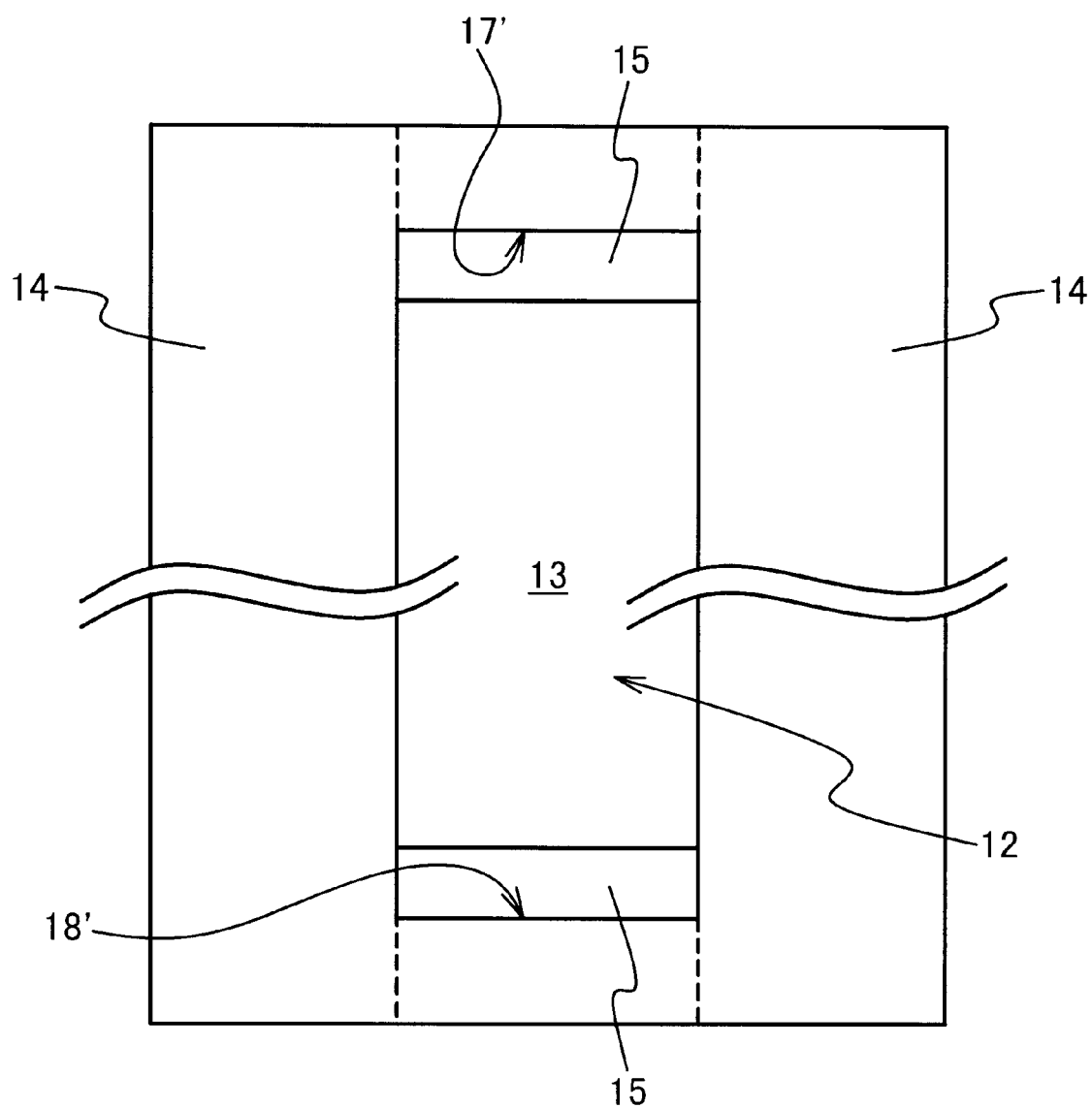

SEMICONDUCTOR LASER DEVICE CAPABLE OF PREVENTING DEGRADATION OF CHARACTERISTICS

BACKGROUND OF THE INVENTION

1. Field of the Invention

The present invention relates to a semiconductor laser device and a method of method of manufacturing the same, and more particularly to a semiconductor laser device such as a red light laser device, and a method of manufacturing the same.

2. Description of the Related Art

An AlGaInP red light laser device is known as a laser used to record data on recording media such as a digital video disc and a magneto-optic disc. As such a conventional red light laser, a self-aligned structure (SAS) type laser is disclosed in Japanese Patent No. 2502835 as shown in FIG. 1. In this conventional laser device, an n-AlGaInP clad layer 102, an active layer 103 and a p-AlGaInP clad layer 104, a GaInP etching stopper layer 105, a p-AlInP confining layer 106, an n-GaAs blocking layer 107, and a p-AlGaAs upper clad layer 109 are formed on a GaAs substrate 101. The confining layer 106 and the blocking layer 107 have a striped opening section, and the upper clad layer 109 is formed on the etching stopper layer 105 in the striped opening section. That is, the upper clad layer 109 contacts the confining layer 106 and the blocking layer 107 in the striped opening.

The AlInP or AlGaInP layer does not absorb a laser beam and is used for the light confining layer 106 so that it is possible to down an oscillation threshold. However, when the conventional SAS type laser is operated in a high output state, the degradation of the end surface of a resonator occurs due to optical damage such as Catastrophic Optical Damage (COD) which has often occurred in general laser devices. Also, a drive current is injected from the opening section of the confining layer 106 and extends in a lateral direction in the p-AlGaInP clad layer 104. As a result, characteristics such as the oscillation threshold, slope efficiency and kink light output are degraded due to the lateral leakage current.

In conjunction with the above description, a semiconductor laser is disclosed in Japanese patent No. 2,502,835. In the semiconductor laser of this reference, a first conductive type AlGaInP clad layer, an active layer and a second conductive type AlGaInP clad layer are formed on a GaAs substrate of the first conductive type. A striped opening section is formed on the clad layer. The semiconductor laser is composed of an AlInP or AlGaInP confining layer with a refractive index smaller than that of the AlGaInP clad layer of the second conductive type. The semiconductor laser is further composed of a second conductive type upper clad layer formed on the confining layer of the second conductive type containing the opening section and having a wider band gap and lower refractive index than the AlGaInP clad layer.

SUMMARY OF THE INVENTION

Therefore, an object of the present invention is provide a semiconductor laser device such as an AlGaInP red light laser device of a SAS-type in which COD on an end surface can be restrained in case of the high output operation, and a method of manufacturing the same.

Another object of the present invention is to provide a semiconductor laser device as a SAS-type laser in which the increase of an oscillation threshold due to lateral leakage current can be restrained, and a method of manufacturing the same.

Still another object of the present invention is to provide a semiconductor laser device as a SAS-type laser in which the decrease of slope efficiency can be restrained, and a method of manufacturing the same.

Yet still another object of the present invention is to provide a semiconductor laser device as a SAS-type laser in which the decrease of kink light output can be restrained, and a method of manufacturing the same.

In an aspect of the present invention, a semiconductor laser device includes an inner lower clad layer formed on a semiconductor layer, an active layer formed on the inner lower clad layer, an inner upper clad layer formed the active layer, a blocking layer formed on the inner upper clad layer to block current, wherein the blocking layer having a concave portion, and an outer upper clad layer formed to cover the blocking layer. Carriers are injected to the active layer through the outer upper clad layer and the concave portion of the blocking layer.

The thickness of the blocking layer in the concave portion is desirably predetermined based on an emission angle and lateral mode of a laser beam emitted from the active layer.

Also, it is desirable that the outer upper clad layer contacts the blocking layer in side walls and a bottom surface of the concave portion. In this case, the thickness of the blocking layer in the concave portion is desirable to be equal to or less than 0.2 $\mu$m.

Also, the impurity density of a portion of the inner upper clad layer which corresponds to the concave portion of the blocking layer is desirably higher than that of another portion of the inner upper clad layer and less than an impurity density of the inner upper clad layer. In this case, the impurity density of the inner upper clad layer portion corresponding to the concave portion is desirably more than $3 \times 10^{16}$ cm$^{-3}$.

Also, the semiconductor laser device may further include a cap layer formed on the blocking layer. In this case, the cap layer having an opening corresponding to the concave portion of the blocking layer, and the inner upper clad layer is formed on the cap layer and contacts inner walls of the opening and side walls and a bottom surface of the concave portion.

In another aspect of the present invention, a semiconductor laser device is formed by (a) forming an inner lower clad layer on a semiconductor layer; by (b) forming an active layer on the inner lower clad layer; by (c) forming an inner upper clad layer the active layer; by (d) forming a blocking layer on the inner upper clad layer to block current; by (e) forming a concave portion in the blocking layer; and by (f) forming an outer upper clad layer to cover the blocking layer, such that carriers are injected to the active layer through the outer upper clad layer and the concave portion of the blocking layer.

The thickness of the blocking layer in the concave portion is desirably predetermined based on an emission angle and lateral mode of a laser beam emitted from the active layer.

Also, in a method of manufacturing the semiconductor laser device, the outer upper clad layer is desirably formed to contact the blocking layer in side walls and bottom surface of the concave portion. In this case, the thickness of the blocking layer in the concave portion may be equal to or less than 0.2 $\mu$m.

Also, the impurity density of a portion of the inner upper clad layer which corresponds to the concave portion of the blocking layer is desirably higher than that of another portion of the inner upper clad layer and less than an impurity density of the inner upper clad layer.

The impurity density of the inner upper clad layer portion corresponding to the concave portion may be more than $3 \times 10^{16}$ cm$^{-3}$.

Also, a cap layer is desirably formed on the blocking layer to have an opening corresponding to the concave portion of the blocking layer.

Also, the temperature when the outer upper clad layer may be formed is higher than a temperature when the inner lower clad layer, the active layer, the upper clad layer, and the blocking layer are formed.

Also, an impurity may be injected from the outer upper clad layer into a portion of the inner upper clad layer when the outer upper clad layer is formed.

BRIEF DESCRIPTION OF THE DRAWINGS

FIG. 3 is a plan view of the semiconductor laser device according to the embodiment of the present invention.

DESCRIPTION OF THE PREFERRED EMBODIMENTS

Hereinafter, a semiconductor laser device of the present invention will be described below in detail with reference to the attached drawings.

In a 660-nm band semiconductor laser device according to an embodiment of the present invention, a multi-layer structure is formed on an AlGaInP laser device wafer. The multi-layer structure is formed on the laser device wafer 20 by use of a reduced pressure OVPE method.

FIGS. 2A to 2H shows cross sectional views of the semiconductor laser device along the line A—A in FIG. 3.

Figure 1:
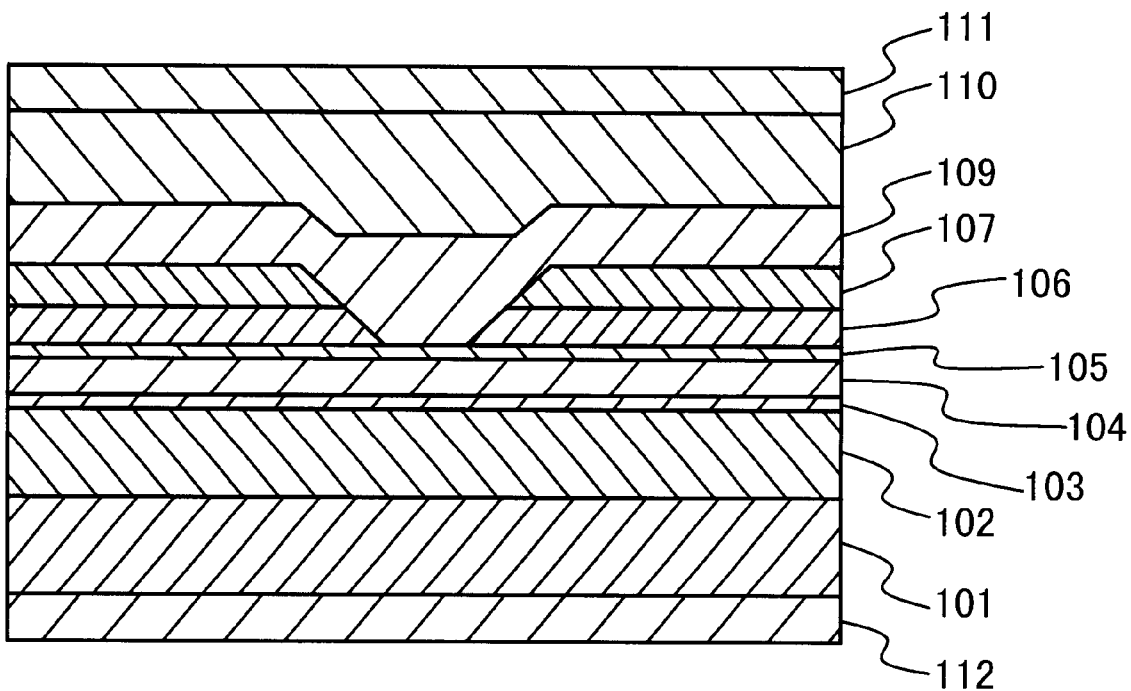
FIG. 1 is a cross sectional view of a conventional semiconductor laser device.
Figure 2A:
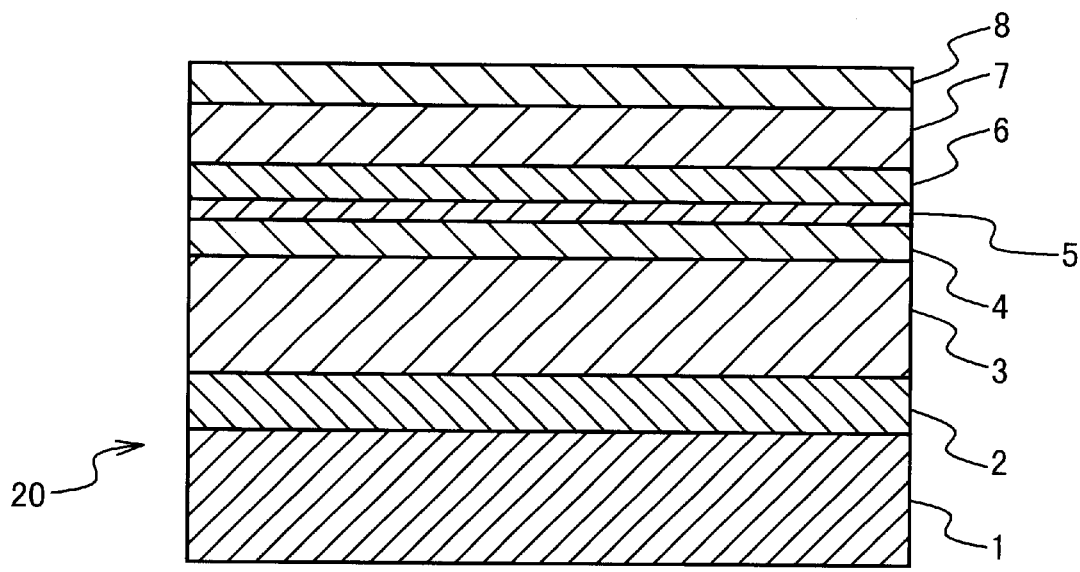
FIGS. 2A to 2H are cross sectional views of a method of manufacturing a semiconductor laser device according to an embodiment of the present invention.

As shown in FIG. 2A, a si-doped GaAs buffer layer 2 (impurity concentration=$1 \times 10^{18}$ cm$^{-3}$) is grown on a Si-dope GaAs (001) substrate 1 to have the thickness of 0.5 μm. Subsequently, a si-doped $Al_{0.75}GaO_{0.25}As$ outer clad layer 3 (impurity concentration=$5 \times 10^{17}$ cm$^{-3}$) is grown on the Si-doped GaAs buffer layer 2 to have the thickness of 1.25 μm. Subsequently, a si-doped $(Al_{0.6}Ga_{0.4})_{0.5}In_{0.5}P$ inner clad layer 4 (impurity concentration=$5 \times 10^{17}$ cm$^{-3}$) is grown on the Si-doped $Al_{0.75}Ga_{0.25}As$ outer clad-layer 3 to have the thickness of 0.3 μm. Then, an active layer 5 is grown on the si-doped $(Al_{0.6}Ga_{0.4})_{0.5}In_{0.5}P$ inner clad layer 4. The active layer 5 is composed of a GaInP active layer (the thickness of 7 nm×4 layers) and an $(Al_{0.6}Ga_{0.4})_{0.5}In_{0.5}P$ barrier layer (the thickness of 5 nm×3 layers). Subsequently, a Zn-doped $(Al_{0.6}Ga_{0.4})_{0.5}In_{0.5}P$ inner clad layer 6 (impurity concentration $3 \times 10^{16}$ cm$^3$) is grown on the active layer 5 to have the thickness of 0.3 μm. Subsequently, Si-doped AlInP current blocking layer 7 (impurity concentration=$5 \times 10^{17}$ cm$^3$) is grown on the Zn-doped $(Al_{0.6}Ga_{0.4})_{0.5}In_{0.5}P$ inner clad layer 6 to have the thickness of 0.5 μm. Subsequently, Zn-doped GaAs cap layer 8 (impurity concentration=$8 \times 10^{17}$ cm$^{-3}$) is grown on the Si-doped AlInP current blocking layer 7 to have the thickness of 0.3 μm. These layers are grown in order. At this time, the growth temperature in such a process is constant and 680° C.

Figure 2B:
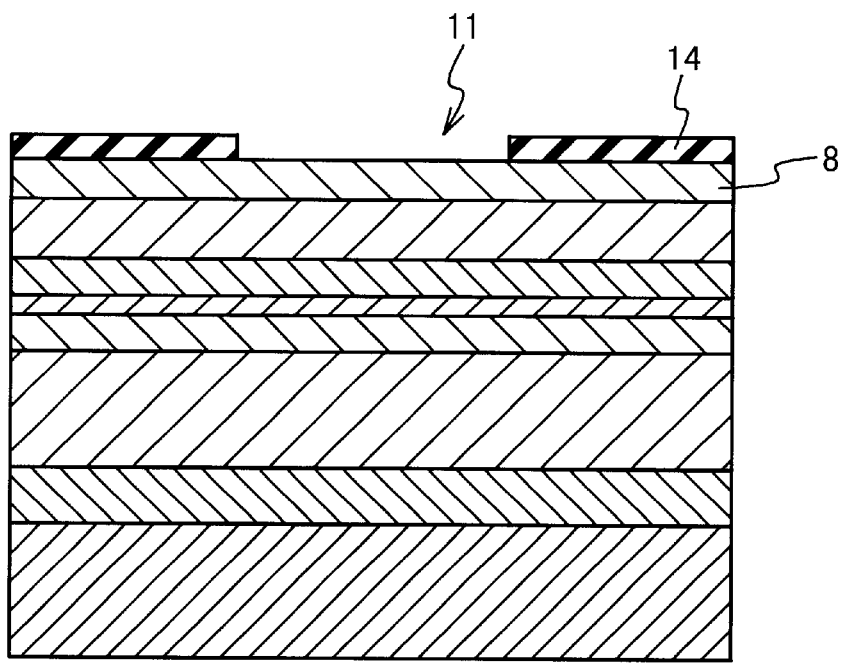
Figure 2C:
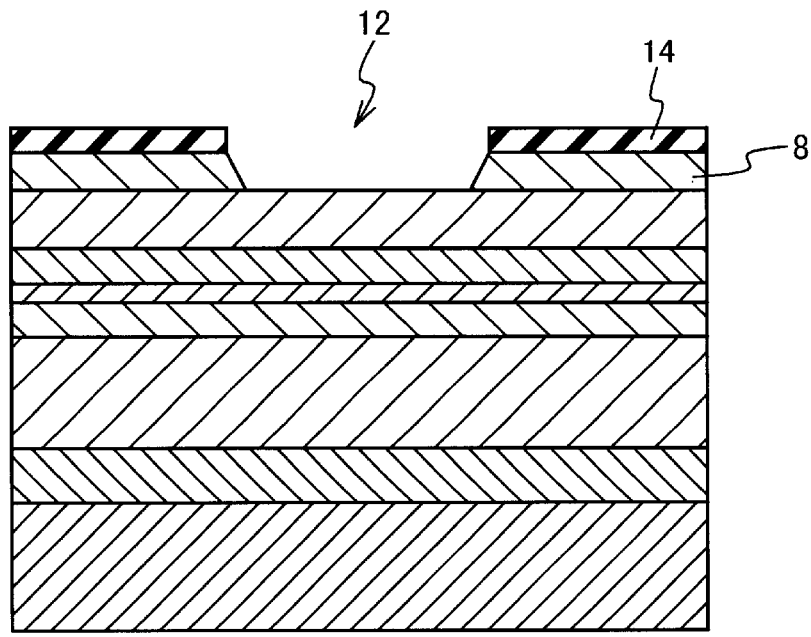

As shown in FIGS. 2B and 2C, a striped opening section is formed in the current blocking layer 7 of the laser device wafer 20. FIG. 2A shows the (−110) cross section of the laser device wafer after a mesa stripe is formed into the direction of [−110]. A SiO$_2$ film 9 is formed on the GaAs cap layer 8 of the laser device wafer 20 as shown in FIG. 2A. The opening section 11 of 3 μm in wide is formed in the SiO$_2$ film into the direction of [−110] by use of photolithography technique and a mask for the opening section, as shown in FIG. 2B. Thus, a SiO$_2$ mask is formed such that only a current injection region is exposed in the striped opening section 12.

Figure 2D:
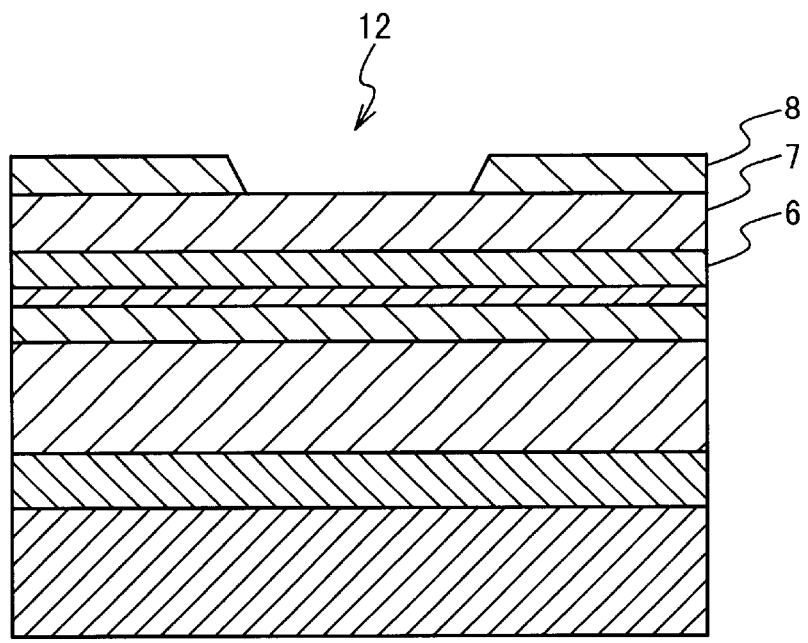
Figure 2E:
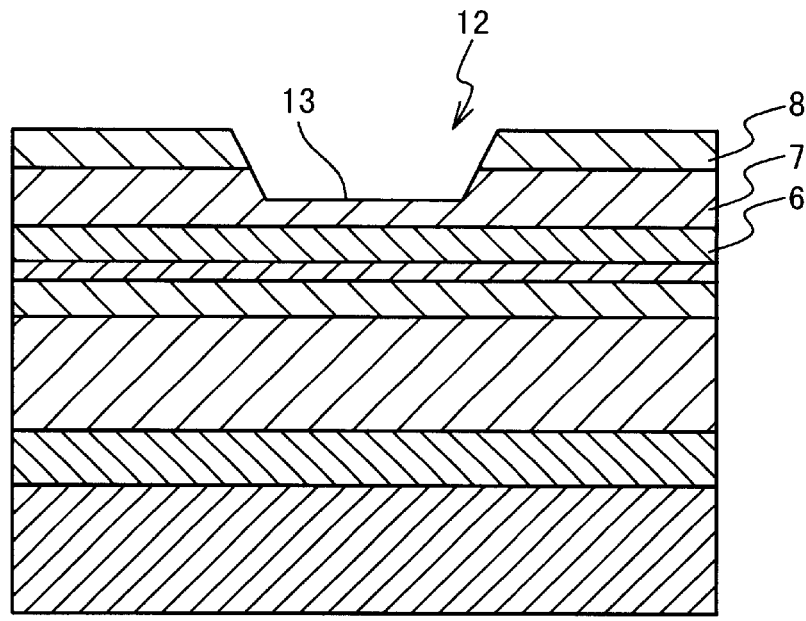

Next, as shown in FIG. 2C, a striped opening section 12 is formed in the GaAs cap layer 8 by a selective wet etching method, using the SiO$_2$ film as a mask 14. Then, the SiO$_2$ mask 14 is removed as shown in FIG. 2D.

Figure 2F:
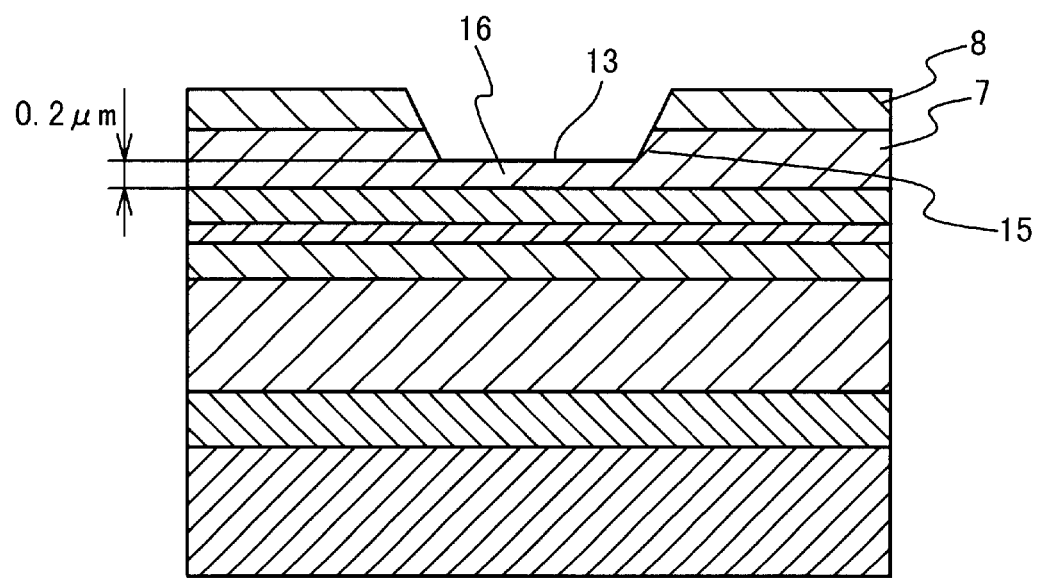

After the entire SiO$_2$ mask 14 is removed, the Si-doped AlInP current blocking layer 7 is etched using the GaAs cap layer 8 with the striped opening section 12 as a mask, as shown in FIG. 2F. The etching is carried out toward the upper surface of the Zn-doped $(Al_{0.6}Ga_{0.4})_{0.5}In_{0.5}P$ inner clad layer 6 in the striped opening section 12. At this time, a thin bottom portion 16 is remained in the striped opening section 12. The remaining bottom portion 16 has the thickness of 0.2 μm, as shown in FIG. 2F. Also, the radiation angle and lateral mode of the laser beam can be changed or adjusted in accordance with the thickness of the remaining bottom portion 16 of the current blocking layer 7. Therefore, the radiation angle and the side mode of the laser beam can be controlled by adjusting the thickness of the remaining bottom portion 16, so that the control is possible to meet the device characteristics. In addition, a current injection region 13 is formed in the bottom of the striped opening section 12 to have the length of 600 μm. Also, the side walls of the AlInP current blocking layer 7 produced through the etching functions as a current non-injection portion 15.

Figure 2G:
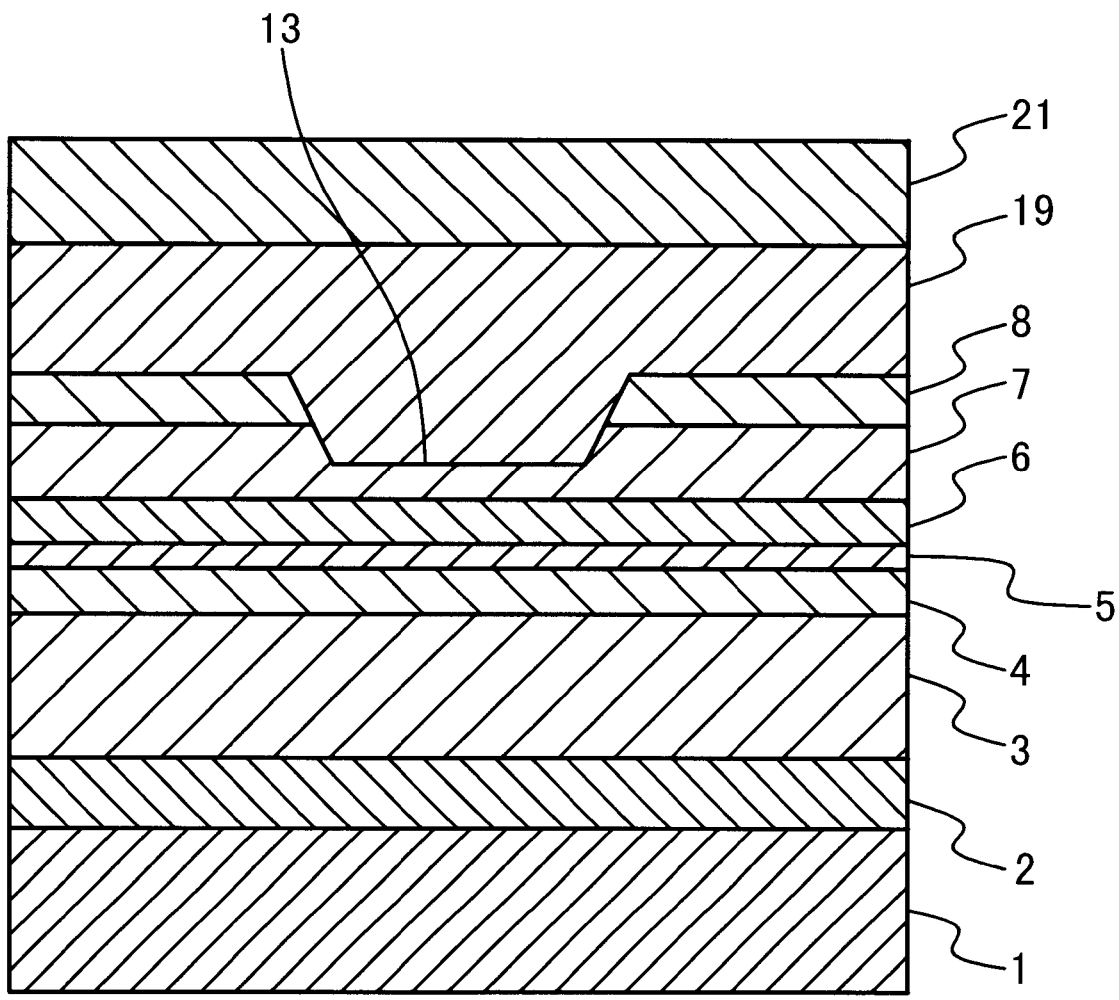

Next, an outer clad layer 19 is formed on the cap layer 8, as shown in FIG. 2G. At this time, the striped opening section 12 is filled with the outer clad layer 19. That is, the Zn-doped $Al_{0.75}Ga_{0.25}As$ outer clad layer 19 (impurity concentration=$1 \times 10^{18}$ cm$^{-3}$) is formed on the Zn-doped GaAs cap layer 8 to have the thickness of 1.25 μm. Through this process, the Zn-doped $Al_{0.75}Ga_{0.25}As$ outer clad layer 19 is grown in the inside of the striped opening section 12. At this time, to restrain the lateral leakage current in case of the laser oscillation, Zn ions are diffused and doped from the Zn-doped $Al_{0.75}Ga_{0.25}As$ outer clad layer 19 into the surface of the Zn-doped $(Al_{0.6}Ga_{0.4})_{0.5}In_{0.5}P$ inner clad layer 6 as a current injection portion while the Zn-doped $Al_{0.75}Ga_{0.75}As$ outer clad layer 19 is grown. The Zn diffusion at this time increases the impurity concentration of the Zn-doped $(Al_{0.6}Ga_{0.4})_{0.5}In_{0.5}P$ clad layer 6 inner clad layer 19 in the current injection portion from $3 \times 10^{16}$ cm$^{-3}$ to $3 \times 10^{17}$ cm$^{-3}$. The difference in the impurity concentration restrains the lateral leakage current in case of the laser oscillation and improves a threshold, slope efficiency and kink light output. For this region selective doping, it is desirable that the Zn concentration of the Zn-doped $Al_{0.75}Ga_{0.75}As$ outer clad layer 19 is equal to or more than $5 \times 10^{17}$ cm$^{-3}$ and that the growth temperature is equal to or higher than 700° C. Subsequently, a Zn-doped GaAs contact layer 21 (impurity concentration=$3 \times 10^{18}$ cm$^{31\ 3}$) is grown on the Zn-doped $Al_{0.75}Ga_{0.25}As$ outer clad layer 19 to have the thickness of 1 μm.

Figure 2H:
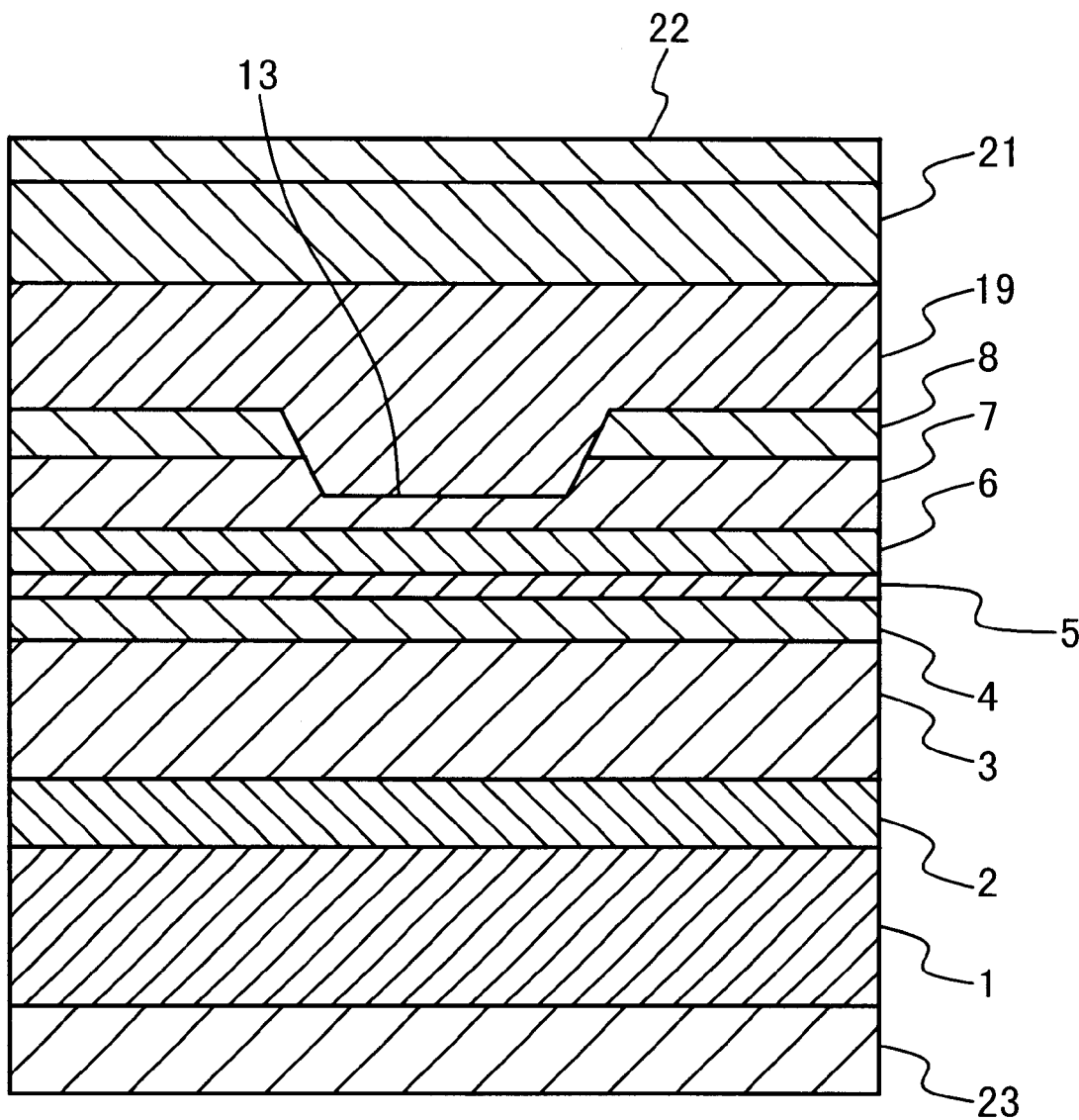

Finally, as shown in FIG. 2H, the p and n contact electrodes 22 and 23 are formed on the both sides of the wafer 20 formed in this way. Thus, 660-nm band laser device wafer 24 is obtained. The laser device wafer is cleaved along the direction of [110] orthogonal to the length direction of the striped opening section 12 and forms the end surfaces of a resonator. At this time, it is desirable that the distance between the end surfaces of the resonator is in a range of 2 μm to 50 μm. After the cleaving, an Al₂O₃ film and Al₂O₃/a-Si multiple film are formed to control the light reflectivity of 10% at the front, 90% at the back. The laser device is coupled to a heat sink. Thus, the laser device of the present invention is completed.

In the above-mentioned SAS type red light laser device, the non-injection portions are formed using the current blocking layer 7. Therefore, the end surface COD degradation can be restrained even in case of high output operation and a long-term stable operation can be realized. Also, the thickness of the remaining bottom portion 16 of the current blocking layer 7 can be changed, so that the lateral mode and radiation angle of the laser beam can be controlled. Moreover, in case of the growth of the outer clad layer 19, the Zn impurities are selectively diffused into the current injection region of the inner clad layer 6, so that the lateral leakage current of the injection current is restrained in the above-mentioned SAS type laser device. The restraint of the lateral leakage current reduces an oscillation threshold and improves slope efficiency. Moreover, the kink light output in the current-light output characteristic is improved.

The above mentioned SAS type laser oscillation device has the end surface non-injection structure. However, the structure can be manufactured through twice growth processes like the conventional SAS type laser. Accordingly, the excellent productivity is kept.

In the laser device of the present invention, the end surface COD degradation can be restrained in case of high output operation of the laser device, and the restraint effect is high, especially, in the AlGaInP red light laser device of an SAS type. Moreover, the AlGaInP red light laser restrains the increase of the oscillation threshold by the lateral leakage current. Also, the decrease of the slope efficiency and the kink light output can be restrained. In addition, the excellent productivity is not changed.

As described above, according to the present invention, a current blocking layer is left and the current non-injection portion is formed. Also, the carrier concentration of the outer clad layer in the striped opening section 12 is higher than the carrier concentration of the inner clad layer directly below the striped opening section. The current non-injection structure is formed using the current blocking layer 7 to restrain the end surface COD degradation in case of high output operation and to realize a long-term stable operation. Also, the lateral leakage current of the injection current is restrained so that the reduction of the oscillation threshold, the improvement of the slope efficiency and kink light output can be attained.

What is claimed is:

1. A semiconductor laser device comprising:
   an inner lower clad layer formed on a semiconductor layer;
   an active layer formed on said inner lower clad layer;
   an inner upper clad layer formed on said active layer;
   a blocking layer formed on said inner upper clad layer to block current, said blocking layer having a concave portion that has a non-zero thickness and is Zn ion diffused; and
   a Zn ion diffused outer upper clad layer formed to cover said blocking layer, wherein carriers are injected to said active layer through said outer upper clad layer and said concave portion of said blocking layer.

2. The semiconductor laser device according to claim 1, wherein a thickness of said blocking layer in said concave portion is predetermined based on an emission angle and lateral mode of a laser beam emitted from said active layer.

3. The semiconductor laser device according to claim 1, wherein said outer upper clad layer contacts said blocking layer in side walls and bottom surface of said concave portion.

4. The semiconductor laser device according to claim 3, wherein a thickness of said blocking layer in said concave portion is equal to or less than 0.2 μm.

5. The semiconductor laser device according to claim 1, wherein an impurity density of a portion of said inner upper clad layer which corresponds to said concave portion of said blocking layer is higher than that of another portion of said inner upper clad layer.

6. The semiconductor laser device according to claim 1, wherein said impurity density of said inner upper clad layer portion corresponding to said concave portion is more than $3 \times 10^{16}$ cm$^{-3}$.

7. The semiconductor laser device according to claim 1, further comprising a cap layer formed on said blocking layer, and
   wherein said cap layer having an opening corresponding to said concave portion of said blocking layer, and said inner upper clad layer is formed on said cap layer and contacts inner walls of said opening and side walls and a bottom surface of said concave portion.

* * * * *